(12) United States Patent
Luebben et al.

(10) Patent No.: US 11,355,161 B2
(45) Date of Patent: *Jun. 7, 2022

(54) ELECTRONIC DEVICE THAT INCLUDES A COMPOSITION THAT CAN RELEASE AND OPTIONALLY GENERATE A GASEOUS OXIDIZING AGENT COMPONENT INTO AN INTERIOR SPACE OF THE ELECTRONIC DEVICE, AND RELATED SUBASSEMBLIES AND METHODS

(71) Applicant: Seagate Technology LLC, Fremont, CA (US)

(72) Inventors: Silvia De Vito Luebben, Golden, CO (US); Rory S. Goodman, Boulder, CO (US); Paul S. Tyler, Apple Valley, MN (US); Paul A. Beatty, Fort Collins, CO (US); Dipeshkumar J. Purani, Shakopee, MN (US); Kendall H. Fung, Longmont, CO (US)

(73) Assignee: Seagate Technology LLC, Fremont, CA (US)

(*) Notice: Subject to any disclaimer, the term of this patent is extended or adjusted under 35 U.S.C. 154(b) by 29 days.

This patent is subject to a terminal disclaimer.

(21) Appl. No.: 16/944,516

(22) Filed: Jul. 31, 2020

(65) Prior Publication Data
US 2021/0043232 A1 Feb. 11, 2021

Related U.S. Application Data

(60) Provisional application No. 62/936,816, filed on Nov. 18, 2019, provisional application No. 62/884,027, filed on Aug. 7, 2019.

(51) Int. Cl.
*G11B 33/02* (2006.01)
*H05K 5/02* (2006.01)
*G11B 33/14* (2006.01)

(52) U.S. Cl.
CPC ........ *G11B 33/022* (2013.01); *H05K 5/0217* (2013.01); *G11B 33/1466* (2013.01); *G11B 33/1486* (2013.01)

(58) Field of Classification Search
CPC ............ G11B 33/1466; G11B 33/1486; G11B 33/022; H05K 5/0217
See application file for complete search history.

(56) References Cited

U.S. PATENT DOCUMENTS

| | | |
|---|---|---|
| 3,140,149 A | 7/1964 | Habernickel |
| 3,650,705 A | 3/1972 | Majewski |

(Continued)

FOREIGN PATENT DOCUMENTS

| | | |
|---|---|---|
| CN | 1524266 A | 8/2004 |
| CN | 1578987 A | 2/2005 |

(Continued)

OTHER PUBLICATIONS

Unpublished Utility U.S. Appl. No. 16/944,573, filed Jul. 31, 2020 (No Copy Enclosed).

(Continued)

*Primary Examiner* — Brian E Miller
(74) *Attorney, Agent, or Firm* — Kagan Binder, PLLC

(57) ABSTRACT

The present disclosure relates to electronic devices that include a composition that generates a gaseous oxidizing agent component within the interior gas space of the electronic device. The present disclosure also relates to electronic devices that include a container that includes a gaseous oxidizing agent component in a manner that the gaseous oxidizing component can transfer from the container to the interior gas space of the electronic device. The present disclosure also involves related methods.

21 Claims, 5 Drawing Sheets

(56) References Cited

U.S. PATENT DOCUMENTS

| | | |
|---|---|---|
| 4,005,182 A | 1/1977 | Ito et al. |
| 4,292,055 A | 9/1981 | De Castella et al. |
| 4,323,465 A | 4/1982 | Downey et al. |
| 4,831,475 A | 5/1989 | Kakuda et al. |
| 4,967,295 A | 10/1990 | Yamauchi et al. |
| 5,012,360 A | 4/1991 | Yamauchi et al. |
| 5,059,291 A | 10/1991 | Yamauchi et al. |
| 5,075,807 A | 12/1991 | Inoue et al. |
| 5,096,549 A | 3/1992 | Yamauchi et al. |
| 5,118,261 A | 6/1992 | Yamauchi et al. |
| 5,293,286 A * | 3/1994 | Hasegawa .......... G11B 33/1453 |
| 5,302,270 A | 4/1994 | Yamauchi et al. |
| 5,392,177 A | 2/1995 | Chainer et al. |
| 5,417,743 A | 5/1995 | Dauber |
| 5,454,157 A | 10/1995 | Ananth et al. |
| 6,110,533 A | 8/2000 | Cote et al. |
| 6,317,286 B1 | 11/2001 | Murphy et al. |
| 6,587,307 B1 | 7/2003 | Raymond et al. |
| 7,062,387 B1 | 6/2006 | Burns et al. |
| 7,460,333 B2 | 12/2008 | Akamatsu et al. |
| 7,478,760 B2 | 1/2009 | Beatty et al. |
| 7,538,972 B2 | 5/2009 | Burts-Cooper et al. |
| 7,695,547 B2 | 4/2010 | Smith |
| 8,094,409 B2 | 1/2012 | Feliss et al. |
| 8,199,425 B1 | 6/2012 | Gustafson et al. |
| 8,254,055 B2 | 8/2012 | Brown |
| 8,451,559 B1 | 5/2013 | Berding et al. |
| 8,885,287 B1 | 11/2014 | Koike et al. |
| 9,058,851 B1 | 6/2015 | Hanke |
| 10,115,436 B1 | 10/2018 | Zhang et al. |
| 10,468,071 B1 | 11/2019 | Tasaka et al. |
| 10,566,031 B2 | 2/2020 | Brand |
| 10,593,372 B2 | 3/2020 | Yap et al. |
| 10,957,363 B1 | 3/2021 | Brand |
| 2003/0179489 A1 | 9/2003 | Bernett et al. |
| 2005/0047001 A1 | 3/2005 | Logan |
| 2005/0241483 A1 | 11/2005 | Okada et al. |
| 2006/0066974 A1 | 3/2006 | Akamatsu et al. |
| 2006/0171065 A1 * | 8/2006 | Akamatsu .......... G11B 33/1453 360/97.12 |
| 2006/0272507 A1 | 12/2006 | Johnson |
| 2009/0244769 A1 | 10/2009 | Dai et al. |
| 2009/0296271 A1 | 12/2009 | Feliss et al. |
| 2011/0149435 A1 | 6/2011 | Brown |
| 2012/0031431 A1 | 2/2012 | Carlson et al. |
| 2014/0377143 A1 | 12/2014 | Ellison et al. |
| 2015/0096884 A1 | 4/2015 | Shealy et al. |
| 2015/0294691 A1 | 10/2015 | Inaba et al. |
| 2016/0104515 A1 | 4/2016 | Strange |
| 2016/0336045 A1 | 11/2016 | Beatty et al. |
| 2019/0365939 A1 | 12/2019 | McGinnis et al. |
| 2021/0043232 A1 * | 2/2021 | Luebben .......... G11B 33/022 |
| 2021/0043233 A1 * | 2/2021 | Luebben .......... G11B 33/1486 |
| 2021/0287719 A1 | 9/2021 | Luebben et al. |

FOREIGN PATENT DOCUMENTS

| | | |
|---|---|---|
| CN | 101447191 A | 6/2009 |
| CN | 101552027 A | 10/2009 |
| CN | 102194465 A | 9/2011 |
| CN | 102403016 A | 4/2012 |
| CN | 103187074 A | 7/2013 |
| CN | 105047217 A | 11/2015 |
| JP | S57164431 A | 10/1982 |

OTHER PUBLICATIONS

Zhengqiang et al., "Analysis of the Mechanical Properties of Head /Disk Interface in Air-Helium Gas Mixtures," Journal of South China University of Technology, vol. 47, No. 3, pp. 44-52, Mar. 2019, (9 pages).

First Chinese Office Action, and English Translation thereof, for Chinese Application No. 202010789195.8, dated Jun. 28, 2021, (15 pages).

Medvedev et al., "Stabilization of Zinc Peroxide in the Combined Process of Granulation and Encapsulation," Theoretical Foundations of Chemical Engineering, vol. 52, No. 4, 2018, (6 pages).

Shames et al., "Unusual Stabilization of Zinc Peroxide by Manganese Oxide: Mechanistic Understanding by Temperature-Dependent EPR Studies," The Journal of Physical Chemistry, vol. 123, Issue 34, pp. 20884-20892. Jul. 18, 2019, (9 pages).

Unpublished Utility U.S. Appl. No. 17/171,047, filed Feb. 9, 2021 (No Copy Enclosed).

First Chinese Office Action, and English Translation thereof, for Chinese CounterpartApplication No. 202010788585.3, dated Jan. 28, 2022, (15 pages).

Li Jingui et al., "Corrosion and Corrosion Control Manual," National Defense Industry Press, p. 343, 1988, (2 pages). For concise explanation of relevance, please see Search Report in Chinese Office Action for Chinese Counterpart Application No. 202010788585. 3.

* cited by examiner

ELECTRONIC DEVICE THAT INCLUDES A COMPOSITION THAT CAN RELEASE AND OPTIONALLY GENERATE A GASEOUS OXIDIZING AGENT COMPONENT INTO AN INTERIOR SPACE OF THE ELECTRONIC DEVICE, AND RELATED SUBASSEMBLIES AND METHODS

CROSS-REFERENCE TO RELATED APPLICATIONS

The present nonprovisional application claims the benefit of commonly owned provisional applications: Ser. No. 62/884,027, filed on Aug. 7, 2019; and Ser. No. 62/936,816, filed on Nov. 18, 2019; wherein the entirety of each of said provisional application is incorporated herein by reference.

The present nonprovisional application is related to patent application titled "ELECTRONIC DEVICE THAT INCLUDES A COMPOSITION THAT CAN ACTIVELY GENERATE AND RELEASE A GASEOUS OXIDIZING AGENT COMPONENT INTO AN INTERIOR SPACE OF THE ELECTRONIC DEVICE, AND RELATED SUBASSEMBLIES AND METHODS" by Luebben et al. and filed on even date herewith, wherein the entirety of said nonprovisional application is incorporated herein by reference.

BACKGROUND

The present disclosure relates to electronic devices such as data storage devices like hard disk drives (HDDs) (internal and/or external), network attached storage (NAS), and the like. There is a continuing need to solve problems related to maintaining internal, electronic drive components in as-built conditions for the service life of the electronic device.

SUMMARY

The present disclosure includes embodiments of an electronic device that includes: a) a housing having an interior gas space; b) one or more electronic components disposed within the housing; and c) a composition that can generate a gaseous oxidizing agent component, wherein the gaseous oxidizing agent component can be generated to provide the gaseous oxidizing agent component in the interior gas space at a mole fraction in the range from 0.1 to less than 20 mole percent based on the total gas in the interior gas space.

The present disclosure includes embodiments of a method of generating a gaseous oxidizing agent component in an electronic device. The method includes a) providing an electronic device and b) operating the electronic device at a temperature that causes the composition to passively decompose and generate the gaseous oxidizing agent component. The electronic device includes: i) a housing having an interior gas space; ii) one or more electronic components disposed within the housing; and iii) a composition that can generate a gaseous oxidizing agent component, wherein the gaseous oxidizing agent component can be generated to provide the gaseous oxidizing agent component in the interior gas space at a mole fraction in the range from 0.1 to less than 20 mole percent based on the total gas in the interior gas space.

The present disclosure includes embodiments of an electronic device that includes a) a housing having an interior gas space; b) one or more electronic components disposed within the housing; and c) a container disposed within the electronic device, wherein the container includes a gaseous oxidizing agent component, wherein the container is configured to passively and/or actively allow gaseous oxidizing agent component to be controllably transferred from inside the container to the interior gas space of the housing.

DETAILED DESCRIPTION

Figure 1:
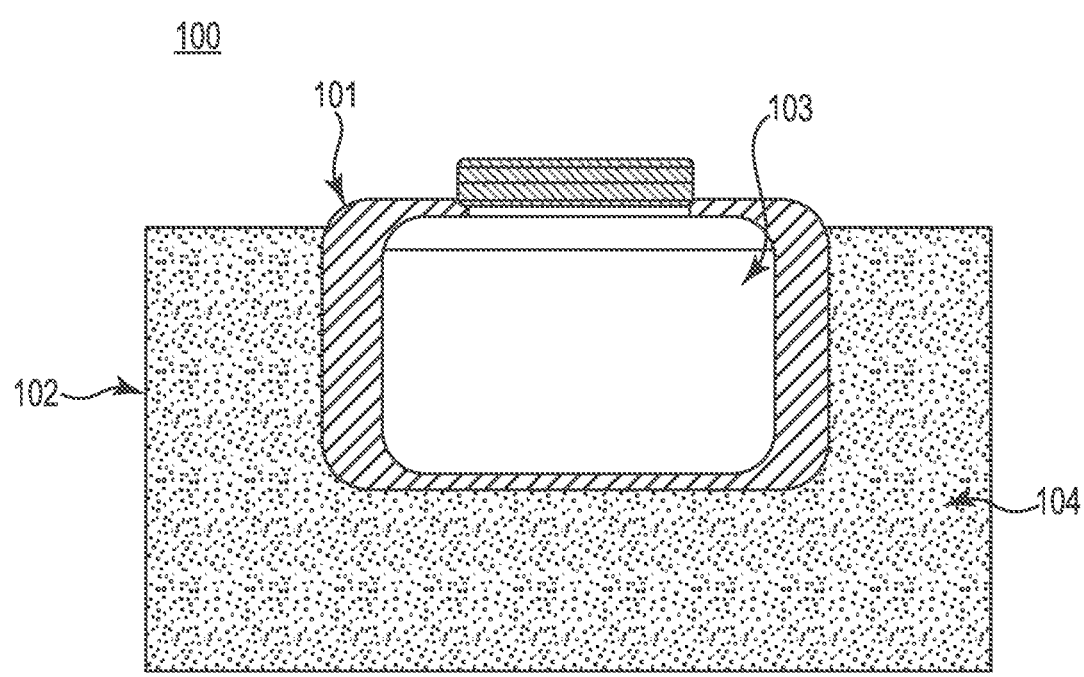
FIG. 1 shows a schematic representation of passive device based on water and reactive oxygen generating compound inside a water-permeable container.

The present disclosure relates to electronic devices that include a composition that generates a gaseous oxidizing agent component within the interior gas space of the electronic device. The present disclosure also relates to electronic devices that include a container that includes a gaseous oxidizing agent component in a manner that the gaseous oxidizing component can transfer from the container to the interior gas space of the electronic device.

A wide variety of electronic devices having an interior space and one or more electronic components disposed within the interior space can benefit by having a container that includes a gaseous oxidizing agent component that can be released into the interior space and/or a composition that generates a gaseous oxidizing agent component after the electronic device is assembled and during at least a portion of it service life as described herein. In some embodiments, an electronic device is a data storage device. Non-limiting examples of data storage devices include hard disk drives (internal and/or external), network attached storage (NAS), and the like. Examples of hard disc drives are reported in U.S. Pat. No. 7,478,760 (Beatty et al.) and U.S. Pat. No. 7,695,547 (Smith), wherein the entireties of said patents are incorporated herein by reference.

For example, in some embodiments, for desirable performance and reliability characteristics in disk drives an operating atmosphere can include an initial fill of a gas mixture that includes primarily helium gas and a second minor gas fraction consisting of a gaseous oxidizing agent component (oxidizer) for the entire operational life of the drive. The purpose of the primarily helium environment is to reduce gas turbulence induced vibration of the drives internal components to facilitate track follow capability across disk track widths of 100 nm or less. The second minor gas component, the gaseous oxidizing agent component can oxidize inorganic and/or organic materials and limit their accumulation on one or more components within the interior of an electronic device such as a hard disk drive as desired (e.g., to maintain one or more electronic components within the interior space in as-built conditions). Chemical reactions between the gaseous oxidizing agent component and inorganic and/or organic materials is believed to result in the formation of gaseous by-products that are free to transport away.

It has been observed that the concentration of oxygen contained in welded HDDs can unfortunately decrease over time. The rate of decrease of oxygen concentration can depend on a variety of factors such as one or more drive operating conditions. The loss of oxygen over time can be attributed to chemical reactions between oxygen and internal drive components. Such internal drive components include, but are not limited to, the recording media, activated carbon, and ferrous metal components. The measured rate of loss of oxygen is expected to result in the oxygen concentration dropping below a desired concentration over the service life of the HDD.

The interior gas space of an electronic device can include helium gas to maintain sufficient vibration mitigation. As the fraction of helium is decreased (e.g., from 100%), the vibrational performance of the drive mechanics can degrade, suggesting it can be beneficial to limit the non-helium oxidizing gas constituents to a minimum mole fraction as desired. The helium gas is present in the interior gas space at a mole fraction of 99 percent or less based on the total gas in the interior gas space (e.g., from 80 to 99 percent, from 80 to 95 percent, from 85 to 95 percent, or even from 85-90 percent).

The interior gas space of an electronic device can have a nominal relative humidity of 20% or less at 25° C., 15% or less at 25° C., 10% or less at 25° C., 5% or less at 25° C., or even 1% or less at 25° C.

In some embodiments, an electronic device can be a hermetically sealed electronic device, which can be defined by, e.g., the amount of gas that leaks from the electronic device after it has been sealed (e.g., a welded HDD). In some embodiments, the interior gas space includes helium gas and the hermetically sealed electronic device has a helium leak rate of $50 \times 10^{-8}$ atm (atmosphere) cc (cubic centimeter)/second or less at 25° C.; $20 \times 10^{-8}$ atm cc/second or less, $10 \times 10^{-8}$ atm cc/second or less; $5 \times 10^{-8}$ atm cc/second or less at 25° C.; or even $4.2 \times 10^{-8}$ atm cc/second or less at 25° C.

The present disclosure involves maintaining the concentration of a gaseous oxidizing agent component in the interior gas space of an electronic device within a desirable range over a variety of operating conditions and for a given time period (e.g., throughout the life of the drive). Maintaining a gaseous oxidizing agent component has the advantage of maintaining the helium mole fraction at a desired level to help provide a favorable mechanical vibration environment, while at the same time maintaining a desired supply of a gaseous oxidizing agent component to reduce or prevent performance impairment of one or more internal, electronic drive components due to insufficient oxidizer supply.

According to one aspect, the present disclosure includes passive approaches for generating a gaseous oxidizing agent component from a composition at a rate selected to maintain a desired concentration of the gaseous oxidizing agent component as described herein. As used herein, "a gaseous oxidizing agent component" includes one or more oxidizing agent species. Nonlimiting examples of oxidizing agent species include atomic oxygen, molecular oxygen, ozone, nitrous oxide, hydrogen peroxide, oxygen radical, dioxygen radicals, and mixtures thereof.

A type and amount of a composition that generates a gaseous oxidizing agent component can be selected based on one or more factors such as the target mole fraction of gaseous oxidizing agent component in the interior space of an electronic device; the operating temperature of an electronic device, which the composition will be exposed to; the service life of the electronic device; and the like. In some embodiments, the composition can be included in an electronic device that has been initially filled with a gas mixture of helium/oxidizing gas species when initially assembled.

In some embodiments, a composition that generates a gaseous oxidizing agent component is selected to be a type and in an amount to generate a gaseous oxidizing agent component so that the gaseous oxidizing agent component is maintained in the interior gas space at a mole fraction in the range from 0.1 to less than 20 mole percent based on the total gas in the interior gas space; a mole fraction in the range from 0.1 to 15 mole percent based on the total gas in the interior gas space; a mole fraction in the range from 0.1 to 10 mole percent based on the total gas in the interior gas space; a mole fraction in the range from 0.1 to 5 mole percent based on the total gas in the interior gas space; a mole fraction in the range from 0.5 to 5 mole percent based on the total gas in the interior gas space; a mole fraction in the range from 0.5 to 4 mole percent based on the total gas in the interior gas space; or even a mole fraction in the range from 1.5 to 3 mole percent based on the total gas in the interior gas space.

A composition that generates a gaseous oxidizing agent component is selected to be a type and in an amount to generate a gaseous oxidizing agent component so that the gaseous oxidizing agent component is maintained in the interior gas space at a desired mole fraction for a desired time period after the electronic device (e.g., hard disk drive) has been finally assembled and ready for service (e.g., at least a portion of the service life of the hard disk drive). In some embodiments, a composition that generates a gaseous oxidizing agent component is selected to be a type and in an amount to generate a gaseous oxidizing agent component so that the gaseous oxidizing agent component is maintained in the interior gas space at a desired mole fraction for a time period of at least two months, or even at least six months. In some embodiments, a composition that generates a gaseous oxidizing agent component is selected to be a type and in an amount to generate a gaseous oxidizing agent component so that the gaseous oxidizing agent component is maintained in the interior gas space at a desired mole fraction for a time period of up to 3 years, up to 4 years, up to 5 years, up to 6 years, up to 7 years, up to 8 years, or even up to 9 years.

A composition that generates a gaseous oxidizing agent component is selected to be a type and in an amount to passively generate a gaseous oxidizing agent component at a desired rate at one or more operating temperatures. In some embodiments, a composition that generates a gaseous oxidizing agent component is selected to be a type and in an amount to generate a gaseous oxidizing agent component at a desired rate at an operating temperature in the range from 5° C. to 75° C., from 5° C. to 65° C., or even from 30° C. to 60° C. For embodiments where the composition generates a gaseous oxidizing agent component passively, the composition can be selected so that it generates a gaseous oxidizing agent component at a sufficiently slow rate so that the composition can last for a desired portion of the service life of the electronic device, as described above.

Passive production a gaseous oxidizing agent component refers to the decomposition of materials or reaction of two or more materials through their inherent physical and chemical properties resulting in the production of a gaseous oxidizing agent component a rate sufficient to maintain the desired concentration of a gaseous oxidizing agent component in an electronic device such as a hard disk drive. Passive generation of gaseous oxidizing agent component is in contrast to active generation of gaseous oxidizing agent component, which refers to the controlled application of active mechanisms such as one or more of heat, light, electrochemical, injected electrons and/or water to oxygen liberating compounds to control the rate at which oxygen is produced.

The materials selected to decompose or react with other can be independently in the form of a solid, a liquid or a gas.

Non limiting examples of generating oxidizing agent species are illustrated below. For example, Equations 1, 2, 3 and 4 below illustrate oxidizing agent species C that can be generated according to the present disclosure. In some embodiments, the oxidizing agent species C is molecular oxygen ($O_2$) and/or nitrous oxide due to their favorable stability.

In some embodiments, the rate of decomposition of A may be accelerated chemically. For example, a catalyst may be used to accelerate the rate of decomposition of A.

In some embodiments, the rate of decomposition of A may be slowed down chemically. For example, a stabilizer may be used to slow down the rate of decomposition of A.

In some embodiments, as discussed below, if the decomposition of A occurs within a pouch or container disposed in an electronic device, the pouch or container can include a barrier material (e.g., film) that can control the rate of diffusion of the oxidizing agent species C to the interior space of the data storage device where it can oxidize inorganic and organic materials of transducer structures as desired.

In equations 1-4 below, A is a chemical composition for generating the oxidizing agent species C in the drive, B is a byproduct of the decomposition, C is the oxidizing agent species, D is a secondary byproduct of decomposition, and E is a catalyst, a stabilizer and/or a barrier. Non-limiting examples of by-products B and D include but are not limited to water, carbon dioxide, carbon monoxide, salts, halogenated compounds, metal oxides, sulfur containing species, nitrogen containing species (e.g., nitrogen oxides), etc., and mixtures thereof.

A → B+C                                       equation 1

A → B+C+D                               equation 2

A+E → B+C                                equation 3

A+E → B+C+D                          equation 4

In some embodiments, molecular oxygen is the desired oxidizing agent species "C" as follows:

A → B+$O_2$
A → B+$O_2$+D
A+E → B+$O_2$
A+E → B+$O_2$+D

The chemical species A includes but is not limited to chemical compounds that contain an oxygen-oxygen bond including but not limited to hydrogen peroxide, peroxo compounds, organic peroxides, organic hydroperoxides, peracids, inorganic peroxides, inorganic hydroperoxides, percarbonates, perborates, perphosphates, persulfates, peroxyhydrate salts, oxygen inclusion compounds, certain oxides, and mixtures thereof. The chemical species A can also include compounds that complex or bind molecular oxygen, hydrogen peroxide, ozone, oxygen radical or dioxygen radical. The chemical species A can also include oxygen rich compounds such as chlorate salts, bromate salts, iodate salts, perchlorate salts, periodate slats, permanganate salts, chromate salts, etc.

In some embodiments, "A" includes calcium peroxide, magnesium peroxide, barium peroxide, zinc peroxide, cadmium peroxide, strontium peroxide, lithium peroxide, sodium peroxide, potassium peroxide, lithium nickel peroxide, potassium superoxide, sodium percarbonate, potassium percarbonate, calcium percarbonate, magnesium percarbonate, sodium perborate, sodium perborate tetrahydrate, potassium perborate, calcium perborate, magnesium perborate, potassium permanganate, sodium persulfate, potassium persulfate, and other peroxyhydrate salts such as potassium pyrophosphate peroxyhydrates and sodium sulfate-hydrogen peroxide-sodium chloride adduct, and mixtures thereof. In some embodiments, "A" includes calcium peroxide, magnesium peroxide, lithium peroxide, potassium superoxide, sodium peroxide, zinc peroxide, sodium percarbonate, sodium perborate, potassium persulfate and sodium persulfate, silver oxide, gold oxide and mixtures thereof. Peroxyhydrate salts useful in the present disclosure are described in U.S. Pat. Nos. 3,650,705, 3,140,149, 4,323,465, and 4,005,182, wherein the entirety of each patent document is hereby incorporated by reference.

In some embodiments, catalyst "E" includes one or more of transition metal oxides, transition metal compounds, manganese oxides, manganese compounds, potassium permanganate, copper oxides, copper compounds, nickel oxides, vanadium oxides, vanadium compounds, iron oxides, iron compounds, arsenic compounds, lead oxides, lead compounds, tin oxides, tin compounds, and mixtures thereof. An optional catalyst may be added to the oxygen generating compound in concentration of 0.1-10% wt. and more preferably from 1-5% wt.

As mentioned above, a composition A that decomposes into an oxidizing agent species C can be in a solid, liquid or gas form. In some embodiments, the composition is in solid form.

Nonlimiting examples of decomposition reactions of a solid composition that generate a gaseous oxidizing agent include:

$CaO_{2(s)} \rightarrow CaO_{(s)} + 0.5O_{2(g)}$
$ZnO_{2(s)} \rightarrow ZnO_{(s)} + 0.5O_{2(g)}$
$MgO_{2(s)} \rightarrow MgO_{(s)} + 0.5O_{2(g)}$
$2\ KO_{2(s)} \rightarrow K_2O_{(s)} + 1.5O_{2(g)}$
$Li_2O_{2(s)} \rightarrow Li_2O_{(s)} + 0.5O_{2(g)}$
$Na_2CO_3 \cdot 1.5H_2O_{2(s)} \rightarrow Na_2CO_{3(s)} + 1.5H_2O_{(g)} + 0.75O_{2(g)}$
$K_2S_2O_{8(s)} \rightarrow K_2S_2O_{7(s)} + 0.5O_{2(g)}$
$NaBO_3 \cdot H_2O_{(s)} \rightarrow NaBO_{2(s)} + H_2O_{(g)} + 0.5O_{2(g)}$ A nonlimiting example of a catalytic reaction (catalyst=$MnO_{2(s)}$) includes the following:

$CaO_{2(s)} + 0.05MnO_{2(s)} \rightarrow CaO_{(s)} + 0.5O_{2(g)} + 0.05MnO_{2(s)}$
$Li_2O_{2(s)} + 0.05V_2O_{3(s)} \rightarrow Li_2O_{(s)} + 0.5O_{2(g)} + 0.05V_2O_{3(s)}$.

Thermogravimetric analysis was performed on sodium percarbonate. Sodium percarbonate decomposes to sodium carbonate and hydrogen peroxide, which in turns decomposes to water and oxygen per the following equation:

$$Na_2CO_3 \cdot 1.5H_2O_{2(s)} \rightarrow Na_2CO_{3(s)} + 1.5H_2O_{(g)} + 0.75O_{2(g)}$$

It was observed that when a 20 mg sample of sodium percarbonate was heated at a rate of 10° C./min under nitrogen (25 mL/min) in a TA 5500 Thermogravimetric Analyzer it entirely decomposed at 150° C. 2 hour isotherms at 80° C., 90° C. and 100° C. under nitrogetn flow of 25 mL/min. showed that sodium percarbonate decomposed relatively more at 100° C. as compared to 80° C. Finally, the weight loss (%) of sodium percarbonate versus time was observed when sodium percarbonate was heated at 60° C. for 24 hrs, which showed that 0.440% was decomposed. Sodium percarbonate would be expected to generate gaseous oxidizing agent component in a desirable manner when placed in a hard disk drive operating at a temperature of 45-75° C. To help control the release of oxygen into the hard disk drive interior gas space, the sodium percarbonate could be placed inside a container of controlled permeability (see discussion below).

In some embodiments, as illustrated by the equations 5-8 below, the chemical composition that generates an oxidizing agent species is a mixture of two or more chemical species F and G that react with each other to generate the oxidizing agent species C.

$$F+G \rightarrow B+C \quad \text{equation 5}$$

$$F+G \rightarrow B+C+D \quad \text{equation 6}$$

$$F+G+E \rightarrow B+C \quad \text{equation 7}$$

$$F+G+E \rightarrow B+C+D \quad \text{equation 8}$$

where F and G are reactants that when reacting with each other generate an oxidizing agent species C in the electronic device (e.g., hard disk drive), B is a byproduct of the reaction, C is an oxidizing agent species, D is a secondary product of reaction, and E is either a catalyst a stabilizer or a barrier. As mentioned above, F and G can each independently be in the form of a solid, liquid or gas state. In some embodiments, the chemical composition F that generates an oxidizing agent species C reacts with a gaseous or liquid species G to produce an oxidizing agent species C. Depending on the conditions (e.g., temperature and pressure) within the interior of an electronic device (e.g., hard disk drive), B, C, and D can each independently be in the form of a solid, liquid, or gas.

F and G can each be selected to provide a desirable rate of reaction and generate a desirable concentration of the gaseous oxidizing agent component. In some embodiments, at least one reactant comprises at least one peroxide. In some embodiments, a first reactant is chosen from calcium peroxide, lithium peroxide, sodium peroxide, potassium peroxide, sodium chlorate and mixtures thereof. In some embodiments, a second reactant is chosen from liquid water, gaseous water, gaseous carbon dioxide, solid iron and mixtures thereof. Nonlimiting examples of reactive systems are illustrated as follows:

$$CaO_{2(s)}+CO_{2(g)} \rightarrow CaCO_{3(s)}+0.5+O_{2(g)}$$
$$Li_2O_{2(s)}+CO_{2(g)} \rightarrow Li_2CO_{3(s)}+0.5O_{2(g)}$$
$$CaO_{2(s)}+H_2O_{(l)} \rightarrow Ca(OH)_{2(s)}+0.5O_{2(g)}$$
$$Li_2O_{2(s)}+H_2O_{(l)} \rightarrow 2Li(OH)_{(s)}+0.5O_{2(g)}$$
$$Na_2O_{2(s)}+H_2O_{(l)} \rightarrow 2Na(OH)_{(s)}+0.5O_{2(g)}$$
$$2KO_{2(s)}+H_2O_{(l)} \rightarrow 2K(OH)_{(s)}+1.5O_{2(g)}$$
$$Na_2O_{2(s)}+H_2O_{(g)} \rightarrow 2Na(OH)_{(s)}+0.5O_{2(g)}$$
$$2KO_{2(s)}+H_2O_{(g)} \rightarrow 2K(OH)_{(s)}+1.5O_{2(g)}$$
$$Na_2O_{2(s)}+CO_{2(g)} \rightarrow Na_2CO_{3(s)}+0.5O_{2(g)}$$
$$2NaClO_{3(s)}+2Fe_{(s)} \rightarrow NaCl_{(s)}+2FeO_{(s)}+2O_{2(g)}$$
$$K_2O_{2(s)}+H_2O_{(l)} \rightarrow 2K(OH)_{(s)}+0.5 \ O_{2(g)}$$

In some embodiments, as similarly described above with respect to the decomposition of A, one or more of the following can be used in combination with the selection of F and G: 1) a catalyst to accelerate the reaction of F and G, 2) a stabilizer to slow down the reaction of F and G, and/or 3) a barrier film or material, to control the rate the diffusion oxidizing agent species C. For example, the rate of such reactions systems may be altered from those of pure compounds by the addition of catalyst materials, stabilizers and/or barrier films/materials to maintain the desired oxygen partial pressure inside the drive. Possible catalysts include but are not limited to transition metal oxides and compounds, manganese oxides, manganese compounds, potassium permanganate, copper oxides, copper compounds, nickel oxides, vanadium oxides, vanadium compounds, iron oxides, iron compounds, arsenic compounds, lead oxides, lead compounds, tin oxides and tin compounds.

In some embodiments a second chemical reaction with desired kinetics is used to produce in situ the reactant F. A non-limiting example of the in situ generation of the reactant F follows: Sodium or potassium hydrogen carbonate is decomposed to produce water and carbon dioxide; the nascent water and carbon dioxide react then in situ with potassium superoxide or lithium peroxide (shown below) to generate oxygen at the desired rate.

$$2NaHCO_{3(s)} \rightarrow Na_2CO_{3(s)}+H_2O_{(g)}+CO_{2(g)}$$
$$Li_2O_{2(s)}+H_2O_{(g)} \rightarrow 2LiOH_{(s)}+0.5O_{2(g)}$$
$$Li_2O_{2(s)}+CO_{2(g)} \rightarrow Li_2CO_{3(s)}+0.5O_{2(g)}$$

Some chemical species may exist in multiple forms for example water may exist and react in either the liquid form and/or the gas form, depending on the temperature.

FIG. 1 shows a schematic representation of passive device 100 based on water 103 inside a water-permeable container 101. In one embodiment, liquid water 103 is contained in a container 101 having at least a portion of the container (e.g., at least a portion of the housing) that has a controlled permeability to water. At least a portion of the container 101 can be in contact with an oxygen releasing compound 104 that reacts with water at a desirable reaction rate. The oxygen releasing compound 104 is contained with a container 102.

The container 101 may have any desired shape. The container 101 may be a capsule, vial or microsphere. As shown, the container may optionally have an opening with a lid. The permeation rate of the water through the container 101 can control the rate of the reaction that generates oxygen. The bottle/tube/vial 101 can be made out of a water permeable material and permits water to transfer through the bottle 101 and into surrounding oxygen generating chemical 104 that can react with water 103.

In some embodiments, a solid composition that can generate a gaseous oxidizing agent component such as pellet or other preparation of such a composition can be placed inside the drive during production.

In some embodiments, a container can be disposed within an electronic device, where the container is initially filled with a gaseous oxidizing agent component and/or contains a composition that can generate a gaseous oxidizing agent component. A container according to the present disclosure can be configured to allow gaseous oxidizing agent component to transfer from inside the container to the interior gas space of the housing to maintain the gaseous oxidizing agent component at a mole fraction as described herein above. Selecting a container and any related components can depend whether the container is initially filled with a gaseous oxidizing agent component and/or the type and amount of composition that can generate a gaseous oxidizing agent component. Selecting a container can also depend on how it is incorporated into an electronic device (e.g., HDD) to release gaseous oxidizing agent into the interior space of the electronic device. For example, whether the container is configured to passively and/or actively allow gaseous oxidizing agent component to be controllably transferred from inside the container to the interior gas space of the housing.

A container that is initially filled with a gaseous oxidizing agent component and/or that contains a composition that can generate a gaseous oxidizing agent component may have any desired shape including a sphere, cylinder, cone, prism, cube, pyramid or rectangular prism, and combination thereof. Furthermore, the container could be a single container or multiple separate containers.

In some embodiments, a container is disposed within an environmental control module. In other embodiments, the container is an environmental control module.

The composition that can generate a gaseous oxidizing agent component can be contained in a container in such a way that oxygen gas would be liberated through natural spontaneous decomposition reactions and passed through a permeable membrane to the internal hard disk drive interior volume, while containing the bulk solid materials (e.g., granules, pellets, and the like) within the container.

In some embodiments, at least a portion of the container is permeable to one or more oxidizing agents such as molecular oxygen. For example, a container can include a membrane that is permeable to the gaseous oxidizing agent component and permits the gaseous oxidizing agent component to transfer from inside the container to the interior gas space of the housing. Oxygen permeable materials for use with or as a container according to the present disclosure include polymers, plastics, rubbers, elastomers, organic coatings, thin glass, and thin ceramics. In some embodiments, such materials have oxygen permeability coefficients between 0.0001 and 1000 (mL mm)/($m^2$ d atm), e.g., oxygen permeability coefficients between 0.01 and 100 (mL mm)/($m^2$ d atm). In some detail, illustrative permeable polymers include low density polyethylene (LDPE), high density polyethylene (HDPE), polypropylene (PP), polyvinylidene fluoride (PVDF), polyvinyl alcohol, ethylene vinyl alcohol, nylon, polycarbonate, polyimide, and combinations thereof. Oxygen permeable membranes include single or multilayer films. In some embodiments, an oxygen permeable membrane can have a thickness from greater than 0 to 500 mils, from 1 to 100 mils, or even from rom 2 to 30 mils. In some embodiments, oxygen permeable materials have permeation coefficients that increase with temperature. In some embodiments, a portion of the container can be made of an oxygen impermeable material and portion of the container is made of oxygen permeable material. For example, a portion of the container can be made of an oxygen impermeable material such as metal or glass and sealed by a lid made of an oxygen permeable membrane that is fastened to the container in any desirable manner (e.g. via glue).

In some embodiments, an entire container is made of an oxygen permeable membrane. For example, such a container can be a pouch that is sealed after the composition that can generate a gaseous oxidizing agent component is place in the pouch or the container can be a vial with a threaded lid that is fastened to the container.

In some embodiments, a container may optionally contain other materials such as absorbents that capture secondary degradation products. For example, water absorbing material can be included to absorb water generated from the oxygen producing reaction. Such water can catalyze, e.g., accelerate, the oxygen producing reaction and/or cause the pressure in the container to increase to an undue degree.

Non-limiting examples of containers that can contain a composition that generates a gaseous oxidizing agent component and/or that can be filled (and pressurized) with a gaseous oxidizing agent component are described herein below.

Figure 2:
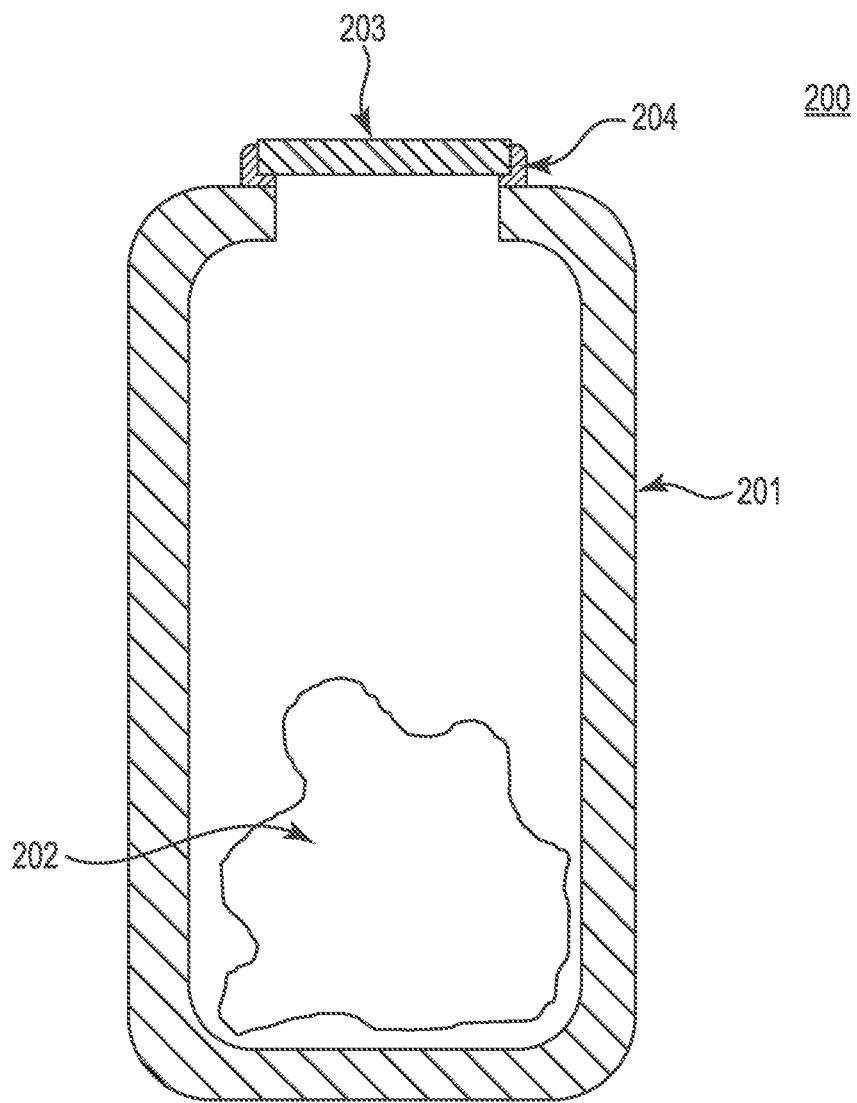
FIG. 2 shows a nonlimiting example of container that passively permits a gaseous oxidizing agent component to transfer from inside the container to outside.

A nonlimiting example of container that passively permits a gaseous oxidizing agent component to transfer from inside the container to outside is shown in FIG. 2. As shown in FIG. 2, the housing 201 of the container 200 is impermeable to oxygen while the lid 203 seals in any solid particulates 202 (e.g., oxygen generating material and optional water absorbent (e.g., molecular sieves) yet is permeable to oxygen. As shown in FIG. 2, the oxygen permeable membrane 203 can be fastened to housing 201 via a bead of glue 204 around the opening of housing 201.

Optionally, lid 203 could be made out of a material that changes permeability with respect to a gaseous oxidizing agent component depending on, e.g., the temperature of the material. For example, lid 203 could be made out of an oxide material that has an electrical heater incorporated therein. The heater could be controlled to change the permeability of the lid 203 to a gaseous oxidizing agent component as the temperature of the lid changes. The heater can be inside the lid 203 or on top of lid 203. The entire container 200 could be heated as well.

In some embodiments, a container (e.g., capsule) can withstand from 1 to 40 atmospheres pressure. In some embodiments, half of a two-piece capsule could be made from one material and the other half from another material. For example, a metal half and polymeric half.

In one experiment, sodium percarbonate (SPC) was tested in a container similar to the container 200 in FIG. 2 according to the conditions in Table 1 below. The container was placed in a HDD, the HDD was sealed as per normal manufacturing procedure, and the drive placed in a chamber at 60C. The pressure of the drive was followed over time. The drive pressure sensor was used to monitor the inner drive pressure of time and a residual gas analyzer was used at the end of the experiment to confirm that the pressure increase in the drive was due to oxygen generation. Group A included Membrane 1 for membrane 203, which was Silicone/Teflon septa (control with high oxygen permeation rate). Oxygen permeability=200-4000 (mL mm)/($m^2$ d atm) at room temperature. Group B included Membrane B for membrane 203, which was 10 mil thick PVDF film from Professional Plastics. Oxygen permeability=1-5 (mL mm)/($m^2$ d atm) at room temperature.

TABLE 1

| Group | # of Vials | Atmosphere in vials | Vial Content 202 | Membrane 203 | Glue 204 | Purpose | Result |
|---|---|---|---|---|---|---|---|
| A | 10 | 1 atm of air - lab humidity | 450 mg SPC + 240 mg molecular sieves (MS) | Teflon ™ septa | Loctite ® Epoxy Adhesive | Control - expected fast releasing, expected drive will go in over pressure similar to no-membrane | Pressure sensor registered a pressure increase of 180 mBars over 15 days |
| B | 5 | 1 atm of air - lab humidity | 450 mg SPC | 10 mil PVDF | Loctite ® Epoxy Adhesive | Control - no MS to check if MS alter decomposition of SPC. | Pressure sensor register a pressure increase of 150 mBars over 75 days |

Pressure versus time was observed for Group A and Group B. The container that included polyvinylidenefluoride (PVDF) slowed the release of oxygen from container as compared to the Teflon™ septa.

In some embodiments, a container can include a valve that can be actuated from a closed position to an open position to allow gaseous oxidizing agent component to flow from inside the container to the interior gas space of the housing.

Figure 3:
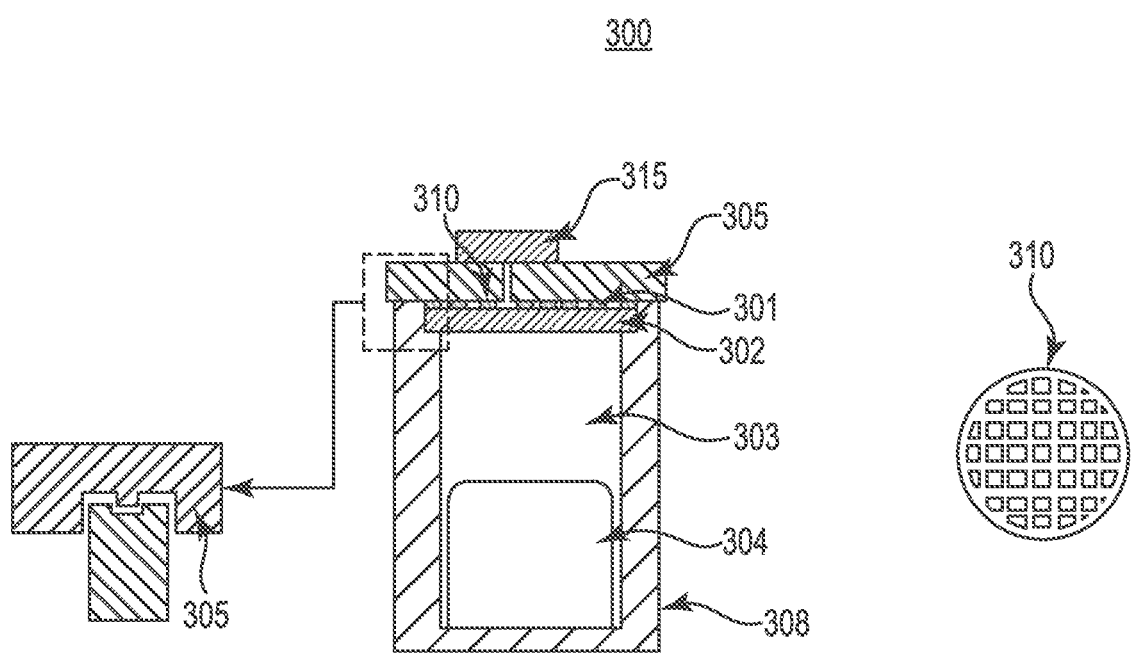
FIG. 3 shows a non-limiting example of a dual chamber container 300 with a permeation layer and micro-valve, which works like a 2-stage regulator.

FIG. 3 shows a non-limiting example of a dual chamber container 300 with a permeation layer and micro-valve, which works like a 2-stage regulator.

Container 300 includes a composition 304 that generates a gaseous oxidizing agent component. Alternatively, the container can be filled (and pressurized) with a gaseous oxidizing agent component (e.g., up to a pressure of 5-10 atm or more) to permit controlled release of oxidizing agent component from container to the interior space of an electronic device (e.g., HDD) to provide oxidizing agent component in amount that maintains the concentration of the oxidizing agent component within a desired range over a desired time period.

As shown, the composition 304 is disposed in a relatively large chamber 303, where chamber 303 functions as an oxygen reservoir. Chamber 301 is a relatively small chamber compared to chamber 303 and functions to define a release volume. Chamber 301 is separated from chamber 303 via an oxygen permeable membrane 302 selected to equilibrate chambers 303 and 301 in about 1 minute to 60 days, and more preferably 1 day to 15 days. A nonlimiting example of membrane 302 includes polyethylene. As shown, a grid 310 is positioned between membrane 302 and cap 305 to help avoid undue plastic deformation of 302 at temperature of about 60° C. Cap 305 can be fastened to housing 308 via welding or bonding (e.g., gluing with an adhesive). As shown, cap 305 is coupled to housing 308 along an interlocking bond line. Cap 305 also optionally includes an electro-mechanical microvalve 315 (e.g., piezoelectric or bimetallic) that can be controllably actuated (e.g., electrically activated) from a closed position to an open position for release of oxygen from container 300.

Container 300 is small enough to fit within the cavity of an electronic device such as a hard disk drive or even inside and environmental control module. Container 300 can be constructed of non-elastic hard housing 308, which can help keep the interior of an electronic device clean.

As mentioned, container 300 functions like a two-stage regulator to equalize pressure from large chamber 303 to small chamber 301 like a tiny scuba tank (in a time period of hours or days). In some embodiments, oxygen can be released from small chamber 301 into the interior of an electronic device every 4-6 weeks. For example, about 1 cubic centimeter per week of oxygen can transfer from chamber 303 to chamber 301. Oxygen can be released from chamber 301 via valve 315 relatively fast. The valve leak rate can be selected to be as low as desired (e.g., about 0.1 cubic centimeter or less per month).

FIGS. 4A-4D illustrate one non-limiting embodiment according to the present disclosure of including a composition that can generate a gaseous oxidizing agent component into a hard disk drive.

Figure 4A:
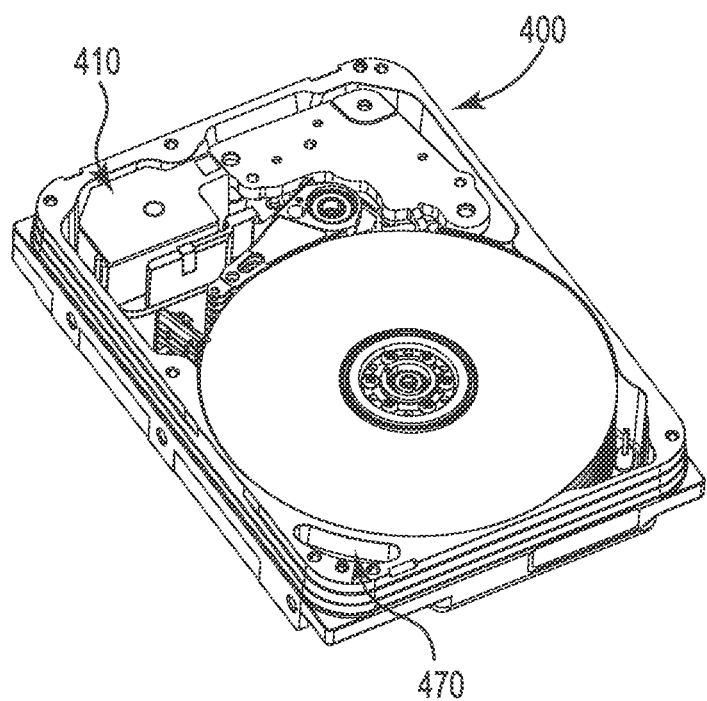
FIGS. 4A-4D illustrate one non-limiting embodiment according to the present disclosure of including a composition that can generate a gaseous oxidizing agent component into a hard disk drive.

FIG. 4A shows a synoptic view of an Environmental Control Module (ECM) 410 according to the present disclosure that is installed in a hard disk drive (HDD) 400 with the top cover removed.

The ECM 410 is referred to as an "expanded" ECM because the ECM has been modified to accommodate a composition 412 that can generate a gaseous oxidizing agent component. An ECM 410 can include an ECM body, a solid composition 412 that can generate a gaseous oxidizing agent component, a desiccant 413 for absorbing moisture, a membrane (e.g., expanded polytetrafluorethylene (ePTFE)) 416 that can contain solid particulate matter within ECM while being permeable to at least oxygen gas so that oxygen gas can transfer from the ECM 410 to the interior of HDD 400 and be consumed by one or more oxidizing reactions.

Figure 4B:
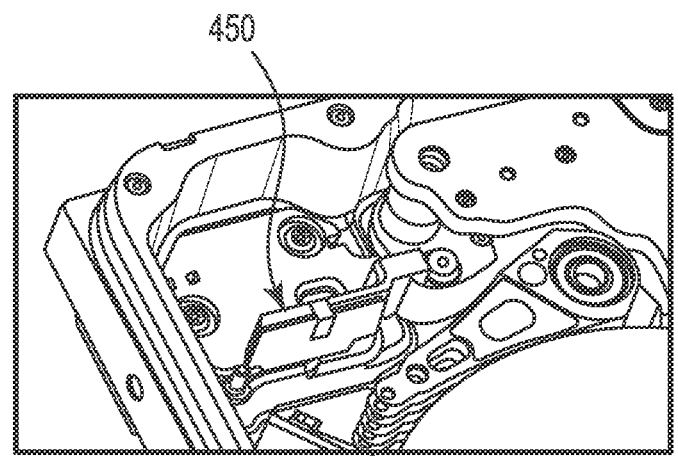

FIG. 4B is a partial view of HDD 400 with ECM 410 removed to show the vertical wall 450 of the PCC with flex connector.

Figure 4C:
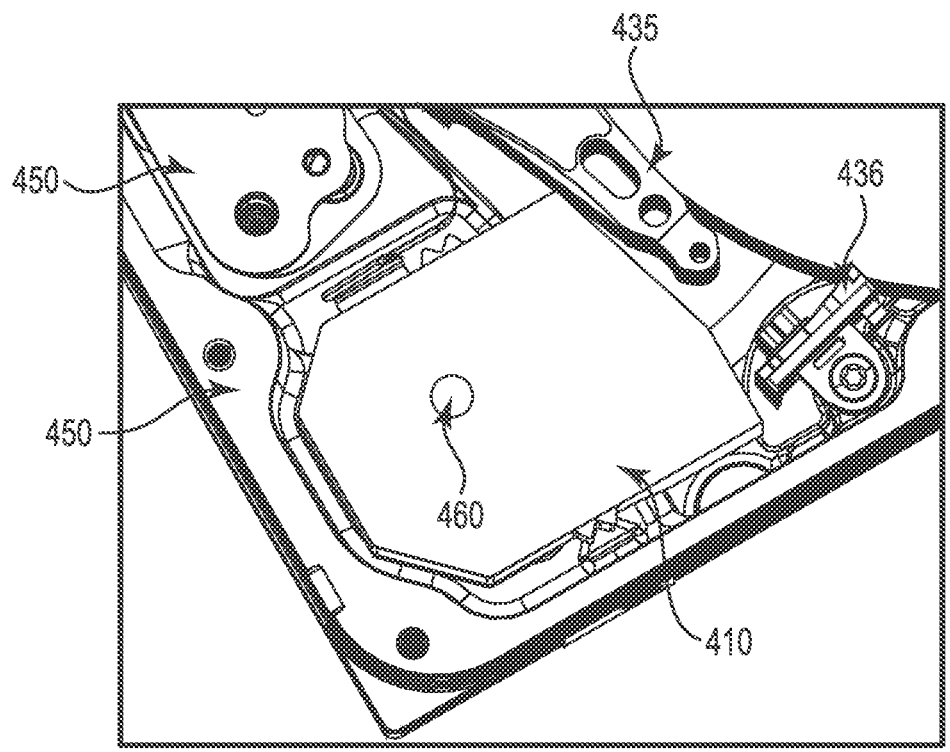
Figure 4D:
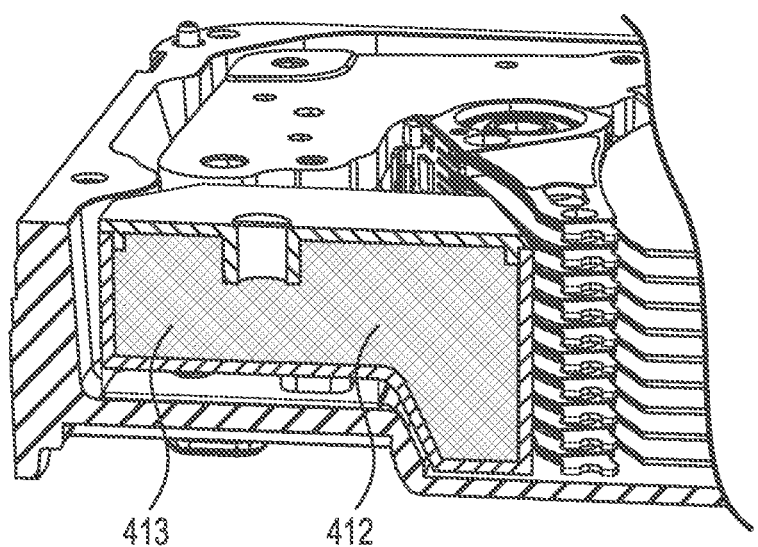

FIG. 4C is another partial view of the expanded Environmental Control Module (ECM) 410 in the corner of the Hard Disk Drive (HDD) 400 between the Voice Coil Motor (VCM) 420 and the Ramp 436. The ECM 410 sits atop the Printed Circuit Connector (PCC) bulkhead (not visible). This expanded ECM 410 has internal volume suitable for containing either an active or passive oxygen generating system. The oxygen generator would be installed within the ECM. As shown in FIG. 4D, the oxygen generator is a solid composition 412 that passively generates a gaseous oxidizing agent component In this embodiment, oxygen can be vented from the part 460 through an aperture covered by permeable membrane 416 shown on the top of the ECM.

The PCC bulkhead contains many electrical conduits to bring power to the VCM 420 and to allow passage of electrical signals between the recording heads and the HDD external environment. It could allow electrical power to be conducted to an active oxygen generator system in ECM 410.

FIG. 4D shows a cross-sectional view ECM 410. As shown, the black volume is the available internal volume for an oxygen generator 412 as well as desiccant 413 for HDD internal humidity control.

Alternatively, a container according to the present disclosure (e.g., vial, capsule, etc.) could be placed a wide variety of other locations within a HDD besides the ECM. For example, as shown in FIG. 4A, a container could be placed in a cavity such as cavity 470. A cavity such as cavity 470 may already be present in base 430 (e.g., to manage the mass of cast in the corner area). As mentioned above, containers according to the present disclosure can contain a composition that generates a gaseous oxidizing agent component and/or that can be filled (and pressurized) with a gaseous oxidizing agent component.

What is claimed is:

1. An electronic device comprising:
   a) a housing having an interior gas space;
   b) one or more electronic components disposed within the housing; and
   c) a composition that passively generates a gaseous oxidizing agent component to provide the gaseous oxidizing agent component in the interior gas space at a mole fraction in the range from 0.1 to less than 20 mole percent based on the total gas in the interior gas space.

2. The electronic device of claim 1, wherein the composition comprises a compound that passively decomposes to generate an oxidizing agent species.

3. The electronic device of claim 2, wherein the composition comprises a compound chosen from calcium peroxide, magnesium peroxide, barium peroxide, zinc peroxide, cadmium peroxide, strontium peroxide, lithium peroxide, sodium peroxide, potassium peroxide, lithium nickel peroxide, potassium superoxide, sodium percarbonate, potassium percarbonate, calcium percarbonate, magnesium percarbonate, sodium perborate, sodium perborate tetrahydrate, potassium perborate, calcium perborate, magnesium perborate, potassium permanganate, sodium persulfate, potassium persulfate, and other peroxyhydrate salts such as potassium pyrophosphate peroxyhydrates and sodium sulfate-hydrogen peroxide-sodium chloride adduct, and mixtures thereof.

4. The electronic device of claim 1, wherein the composition comprises at least sodium percarbonate.

5. The electronic device of claim 1, wherein the composition further comprises a catalyst chosen from one or more of transition metal oxides, transition metal compounds, manganese oxides, manganese compounds, potassium permanganate, copper oxides, copper compounds, nickel oxides, vanadium oxides, vanadium compounds, iron oxides, iron compounds, arsenic compounds, lead oxides, lead compounds, tin oxides, tin compounds, and mixtures thereof.

6. The electronic device of claim 1, wherein the composition comprises at least two reactants that react with each other to generate an oxidizing agent species.

7. The electronic device of claim 6, wherein the composition comprises at least a first reactant chosen from calcium peroxide, lithium peroxide, sodium peroxide, potassium peroxide, sodium chlorate and mixtures thereof, and a second reactant chosen from liquid water, gaseous water, gaseous carbon dioxide, solid iron and mixtures thereof.

8. The electronic device of claim 6, wherein the composition further comprises a catalyst chosen from manganese oxides, potassium permanganate, copper oxides, nickel oxides, vanadium oxides, iron oxides and combinations thereof.

9. The electronic device of claim 1, wherein the interior gas space comprises helium gas, wherein the helium gas is present in the interior gas space at a mole fraction of 99 percent or less based on the total gas in the interior gas space.

10. The electronic device of claim 1, wherein the composition ean generates the gaseous oxidizing agent component over a time period of at least two months.

11. The electronic device of claim 1, wherein the interior gas space nominal relative humidity of 20% or less at 25° C.

12. The electronic device of claim 1, further comprising a container disposed within the electronic device, wherein the composition that generates a gaseous oxidizing agent component is disposed within the container.

13. The electronic device of claim 12, wherein the container is configured to allow the gaseous oxidizing agent component to transfer from inside the container to the interior gas space of the housing.

14. The electronic device of claim 13, wherein the container is configured to allow the gaseous oxidizing agent component to be controllably transferred from inside the container to the interior gas space of the housing to maintain the gaseous oxidizing agent component at a mole fraction in the range from 0.1 to less than 20 mole percent based on the total gas in the interior gas space.

15. The electronic device of claim 14, wherein the container is configured to allow the gaseous oxidizing agent component to be controllably transferred from inside the container to the interior gas space of the housing, wherein the container is disposed within an environmental control module or the container is an environmental control module, wherein transfer of the gaseous oxidizing agent component from inside the container to the interior gas space of the housing is passively controlled, actively controlled, or both passively and actively controlled.

16. The electronic device of claim 15, wherein the container comprises a membrane that is permeable to gaseous oxidizing agent component and permits transfer of the gaseous oxidizing agent component from inside the container to the interior gas space of the housing to be passively controlled.

17. The electronic device of claim 1, wherein the interior gas space comprises helium gas and the device has a helium leak rate of $50 \times 10^{-8}$ atm (atmosphere) cc (cubic centimeter)/second or less at 25° C.

18. A method of generating a gaseous oxidizing agent component in an electronic device, wherein the method comprises:
   a) providing an electronic device comprising:
      i) a housing having an interior gas space;
      ii) one or more electronic components disposed within the housing; and
      iii) a composition that can generates a gaseous oxidizing agent component to provide the gaseous oxidizing agent component in the interior gas space at a mole fraction in the range from 0.1 to less than 20 mole percent based on the total gas in the interior gas space; and
   b) operating the electronic device at a temperature that causes the composition to passively decompose and generate the gaseous oxidizing agent component.

19. An electronic device comprising:
   a) a housing having an interior gas space;
   b) one or more electronic components disposed within the housing; and
   c) a container disposed within the electronic device, wherein the container includes a gaseous oxidizing agent component, wherein the container is configured to allow the gaseous oxidizing agent component to be controllably transferred from inside the container to the interior gas space of the housing, wherein transfer of the gaseous oxidizing agent component from inside the container to the interior gas space of the housing is passively controlled, actively controlled, or both passively and actively controlled.

20. The electronic device of claim 19, wherein the container comprises a membrane that is permeable to gaseous oxidizing agent component and permits transfer of the gaseous oxidizing agent component from inside the container to the interior gas space of the housing to be passively controlled.

21. The electronic device of claim 19, wherein the container comprises a valve that can be actuated from a closed position to an open position to allow flow of the gaseous oxidizing agent component from inside the container to the interior gas space of the housing to be actively controlled.

* * * * *